United States Patent
Watanabe (10) Patent No.: US 7,538,311 B2
(45) Date of Patent: May 26, 2009

(54) IMAGE SENSOR AND DIGITAL CAMERA (75) Inventor: Mikio Watanabe, Asaka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/892,432

(22) Filed: Aug. 23, 2007

(65) Prior Publication Data
US 2008/0068478 A1 Mar. 20, 2008

(30) Foreign Application Priority Data
Sep. 14, 2006 (JP) ............... 2006-248980

(51) Int. Cl.
H01L 27/00 (2006.01)
H01L 27/14 (2006.01)

(52) U.S. Cl. .............. 250/226; 250/208.1; 250/221; 348/294; 257/432; 257/433

(58) Field of Classification Search ............ 250/208.1, 250/226, 370.08, 332, 330, 221; 348/294; 257/431, 433, 678
See application file for complete search history.

(56) References Cited

U.S. PATENT DOCUMENTS 4,507,674 A * 3/1985 Gaalema ................ 257/436
5,808,350 A * 9/1998 Jack et al. ................ 257/440
7,332,701 B2 * 2/2008 Van Arendonk et al. .. 250/208.1
2008/0029708 A1 * 2/2008 Olsen et al. ................ 250/372

FOREIGN PATENT DOCUMENTS

| JP | A 6-177416 | 6/1994 |
| JP | A 7-043600 | 2/1995 |
| JP | A 7-083614 | 3/1995 |
| JP | A 10-210486 | 8/1998 |

* cited by examiner

Primary Examiner—Georgia Y Epps
Assistant Examiner—Tony Ko
(74) Attorney, Agent, or Firm—Margaret A. Burke; Sheldon J. Moss

(57) ABSTRACT

The present invention provides an image sensor that includes a plurality of light-receiving elements and a charge output component. The plurality of light-receiving elements are disposed inside the image sensor in a matrix arrangement corresponding to respective pixels. The light-receiving elements each includes a light-receiving surface at a front face and accumulates charge in accordance with light amounts received at the light-receiving surface. The charge output component outputs the charges accumulated at the plurality of light-receiving elements to outside the image sensor. The image sensor is configured to enable incidence of light on rear faces of the plurality of light-receiving elements. The plurality of light-receiving elements are capable of accumulating charges in accordance with light amounts received at the rear faces.

14 Claims, 9 Drawing Sheets

IMAGE SENSOR AND DIGITAL CAMERA

CROSS-REFERENCE TO RELATED APPLICATION

This application claims priority under 35 USC 119 from Japanese Patent Application No. 2006-248980, the disclosure of which is incorporated by reference herein.

BACKGROUND OF THE INVENTION

1. Field of the Invention

The present invention relates to an image sensor and a digital camera, and more particularly to a charge accumulation-type image sensor, which accumulates charges in accordance with light amounts of incident light, and a digital camera which employs this image sensor.

2. Description of the Related Art

In recent years, with increases in resolutions of solid state imaging devices, such as CCD (charge coupled device) area sensors, CMOS (complementary metal oxide semiconductor) image sensors and the like, demand has rapidly increased for information technology devices with photography functions, such as digital electronic still cameras, digital video cameras, portable telephones, PDAs (personal digital assistants, which are portable information terminals) and the like. Herein, the above-described information devices with photography functions based on solid state imaging devices will be referred to as digital cameras.

Meanwhile, in recent years there have been requests for these various digital cameras to take photographs of non-visible light images as well as conventional photographs of visible light images. For example, if it were possible to take photographs of infrared images, it would be possible to take photographs at night, and suchlike.

Heretofore, as a technology which can be applied in answer to such requests, Japanese Patent Application Laid-Open (JP-A) No. 6-177416 has disclosed a technology of forming an illumination sensor device, which is formed of a diffusion region and an N region on a silicon substrate, forming a separate P region adjacent thereto, and imaging visible light and infrared light at the same surface.

Furthermore, JP-A No. 10-210486 has disclosed a technology which utilizes plural separation components and CCDs, including a separation component such as a cold mirror that separates visible light from non-visible light or the like, to enable imaging of visible light and non-visible light.

However, with the technology disclosed in JP-A No. 6-177416, the two types of sensor device, and electrodes thereof, are disposed at the same light-receiving surface. Therefore, in comparison with a case of receiving only visible light or only non-visible light at the same light-receiving surface, light-receiving areas for both visible light and infrared light are smaller and imaging sensitivity is lowered, which is a problem. Furthermore, with the technology disclosed in the same JP-A No. 6-177416, because refractive indices of optical elements vary in accordance with differences between wavelengths of the light that is incident at the sensors, focusing distances of the visible light and the infrared light differ. Consequently, it is difficult to focus both the visible light and the infrared light with excellent characteristics, which is a problem.

Meanwhile, with the technology disclosed in JP-A No. 10-210486, a plurality of CCDs are required. As well as leading to increases in power consumption and costs, this leads to an increase in size of the equipment, and these are problems.

SUMMARY OF THE INVENTION

The present invention has been devised in order to solve the problems described above, and an object of the present invention is to provide an image sensor and digital camera capable of imaging lights of different wavelengths without this leading to a reduction in imaging sensitivity, a deterioration in focusing characteristics, increases in power consumption and/or costs, or an increase in equipment size.

An image sensor of an aspect of the present invention includes: a plurality of image-receiving elements disposed inside the image sensor in a matrix arrangement corresponding to respective pixels, the light-receiving elements each including a light-receiving surface at a front face and accumulating charge in accordance with light amounts of light received at the image-receiving surface; and a charge output component which outputs the charges accumulated at the plurality of light-receiving elements to outside the image sensor, the image sensor being structured to enable incidence of light on rear faces of the plurality of light-receiving elements, and the plurality of light-receiving elements being capable of accumulating charges in accordance with light amounts of light received at the rear faces.

DETAILED DESCRIPTION OF THE INVENTION

Herebelow, embodiments of the present invention will be described in detail with reference to the drawings.

First Embodiment

First, overall structure of an imaging device 50 relating to the present embodiment will be described with reference to the structural side view of FIG. 1.

Figure 1:
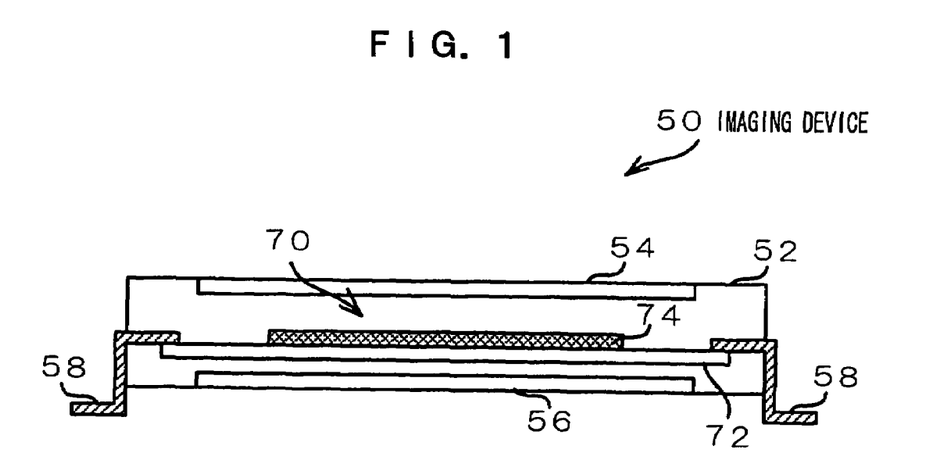
FIG. 1 is a sectional side view showing structure of an imaging device relating to an embodiment of the present invention.

As shown in FIG. 1, the imaging device 50 relating to the present embodiment is structured with an image sensor 70 which has been sealed in a case 52. The image sensor 70 is integrally structured by a glass substrate 72 and a sensor portion 74. A transparent glass plate 54 is provided at a front face of the case 52 and a transparent glass plate 56 is provided at a rear face of the case 52.

The sensor portion 74 is supported at the middle of the imaging device 50, and is provided with plural light-receiving elements in a matrix pattern corresponding to respective pixels. The glass substrate 72 forms electrical connections between the sensor portion 74 and electrodes (terminals) 58 of the imaging device 50, and performs the function of reinforcing the sensor portion 74.

The sensor portion 74 is capable of receiving light through both a front face (the upper face in FIG. 1) and a rear face (the lower face in FIG. 1) thereof. The transparent glass plate 54 is specified with dimensions and position to enable incidence of light onto the whole of a front face side light-receiving surface of the sensor portion 74, and the transparent glass plate 56 is specified with dimensions and position to enable incidence of light onto the whole of a rear face side light-receiving surface of the sensor portion 74.

Figure 2A:
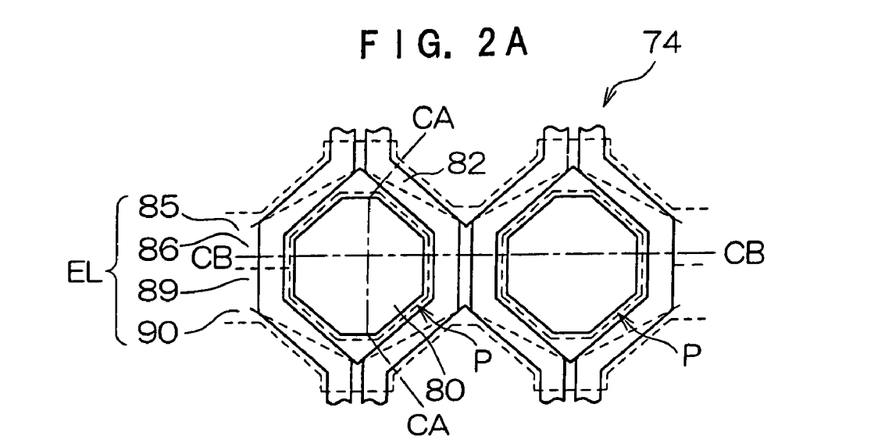
FIG. 2A is a partial plan view of an imaging region at a sensor portion of an image sensor relating to the embodiment of the present invention.

FIG. 2A is a partial plan view of an imaging region of the sensor portion 74, showing two pixels P which neighbor one another within the imaging region. Each pixel P includes a light-receiving element 80, constituted with a photodiode which accumulates charge in accordance with light amounts of light that is received. Vertical charge transfer paths 82 are disposed at both left and right of the pixel P.

As shown by the broken lines, polysilicon transfer electrodes 85, 86, 89 and 90 (EL) for four-phase driving are disposed over the vertical charge transfer paths 82. For example, in a case in which transfer electrodes are formed with two layers of polysilicon, the transfer electrodes 85 and 89 are formed in, for example, a first polysilicon layer, and the transfer electrodes 86 and 90 are formed in a second polysilicon layer. The transfer electrode 85 controls reading of charge from the light-receiving element 80 to the vertical charge transfer path 82.

Figure 2B:
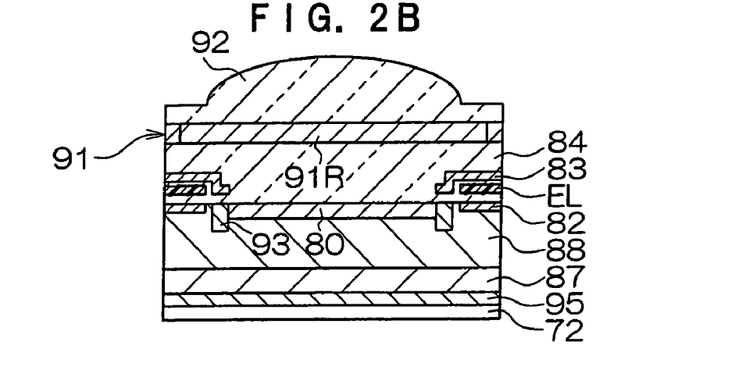
FIG. 2B is a sectional view cut along line CA of FIG. 2A.
Figure 2C:
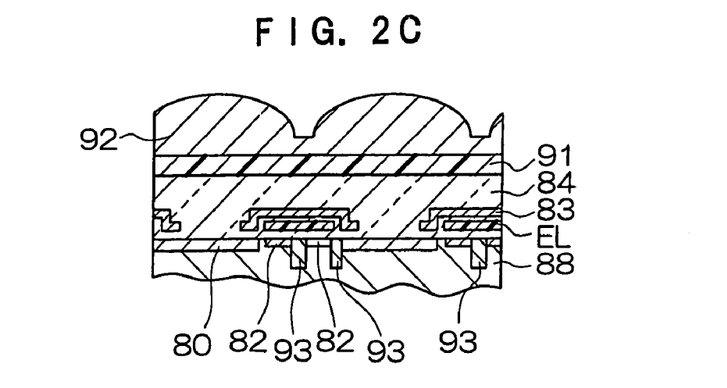
FIG. 2C is a sectional view cut along line CB of FIG. 2A.

FIGS. 2B and 2C are sectional views cut along lines CA and CB, respectively, of FIG. 2A. As shown in FIG. 2B, a p-type well 88 is formed at a surface of an n-type semiconductor substrate 87. An n-type region is formed at a surface region of the p-type well 88, and this structures the light-receiving element 80. A p+-type region 93 is a channel stop region for implementing electrical separation of the pixel P from the vertical charge transfer paths 82 and the like.

As shown in FIG. 2C, an n-type region which constitutes the vertical charge transfer path 82 is provided near the n-type region that structures the light-receiving element 80. The p-type well 88, between the light-receiving element 80 and the vertical charge transfer paths 82, structures a reading transistor.

An insulation layer such as a silicon oxide film or the like is formed at a surface of the n-type semiconductor substrate 87, and the transfer electrodes EL formed of polysilicon are formed on the insulation layer. The transfer electrodes EL are disposed so as to cover the vertical charge transfer paths 82. A further insulation layer formed of silicon oxide or the like is formed on the transfer electrodes EL. A light-blocking film 83, including opening portions which open upward, is formed of tungsten or the like on this insulation layer so as to cover the vertical charge transfer paths 82 and suchlike. An inter-layer insulation film 84, formed of phosphosilicate glass or the like, is formed so as to cover the light-blocking film 83, and a surface of the inter-layer insulation film 84 is smoothed.

A color filter layer 91 is formed on the inter-layer insulation film 84. The color filter layer 91 includes color regions of three or more colors (three colors in the present embodiment) such as, for example, red regions 91R, green regions and so forth. Microlenses 92 are formed of a resist material or the like on the color filter layer 91 to correspond with the pixels P.

As shown in FIG. 2B, the microlenses 92 are formed one-to-one above the pixels P. The color filters, which are the red regions 91R and the like, are disposed below the microlenses 92. Light which passes through a color filter is incident at the light-receiving element 80. The microlenses 92 focus light incident from above onto the opening portions of the light-blocking film 83.

Meanwhile, a non-visible light filter layer 95 is formed at the rear face of the n-type semiconductor substrate 87. The non-visible light filter layer 95 includes non-visible light regions which transmit non-visible light (infrared light in the present embodiment). A rear face of the non-visible light filter layer 95 is applied to the glass substrate 72.

A layer thickness of the n-type semiconductor substrate 87 is set to a thickness that enables transmission of the non-visible light therethrough (for example, 20 μm). As the glass substrate 72, a material with high transmissivity with respect to the non-visible light is employed. With this structure, the light-receiving element 80 can receive light from both the front face and the rear face of the sensor portion 74, and charges can be accumulated in accordance with light amounts of received light. The layer thickness of the n-type semiconductor substrate 87 is preferably as thin as possible in consideration of a transmission ratio of the non-visible light, but when the layer thickness is thinner, strength of the image sensor 70 is lower. Accordingly, in the image sensor 70 relating to the present embodiment, the glass substrate 72 is employed in order to compensate for this reduction in strength.

Figure 3A:
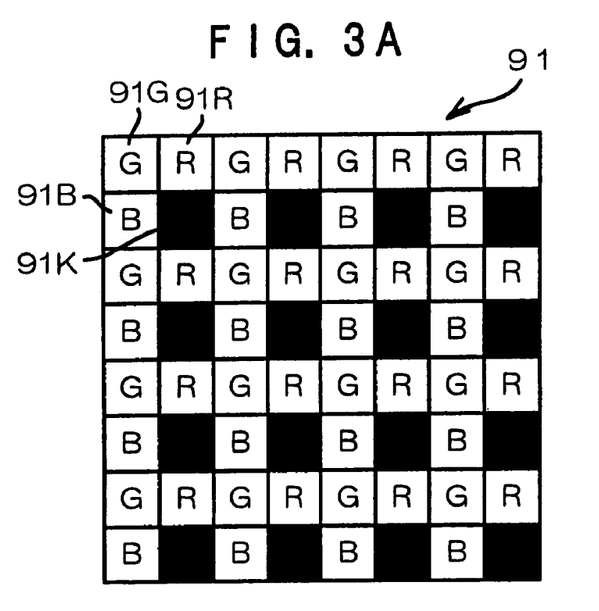
FIG. 3A is a schematic plan view showing structure of a color filter layer relating to a first embodiment of the present invention.
Figure 3B:
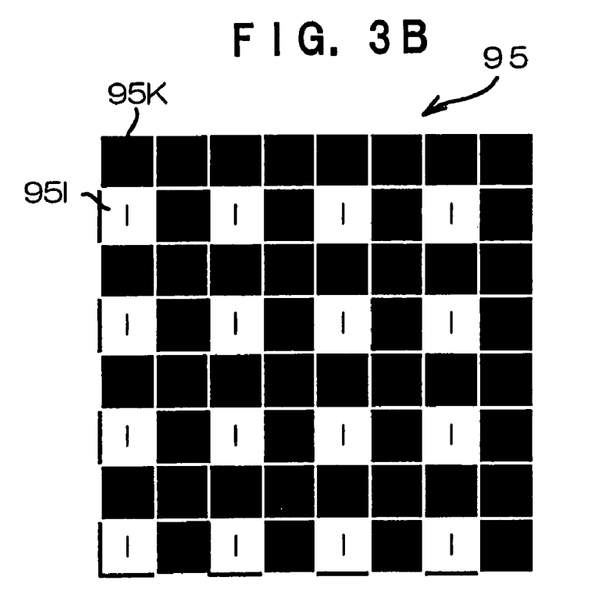
FIG. 3B is a schematic plan view showing structure of a non-visible light filter layer relating to the first embodiment of the present invention.

Now, FIG. 3A shows structure of the color filter layer 91 relating to the present embodiment (a structure as viewed from the front face), and FIG. 3B shows structure of the non-visible light filter layer 95 relating to the present embodiment (a structure as viewed from the rear face).

As is shown in FIG. 3A, the color filter layer 91 relating to the present embodiment is structured by arraying plural sets in a matrix pattern, each set being the red region 91R which transmits red light, a green region 91G which transmits green light, a blue region 91B which transmits blue light, and a light-blocking region 91K which does not transmit light. In contrast, as shown in FIG. 3B, when the non-visible light filter layer 95 relating to the present embodiment is provided at the image sensor 70, non-visible light regions 95I which transmit non-visible light (in the present embodiment, infrared light) are arrayed only at positions that correspond to the light-blocking regions 91K of the color filter layer 91. Other regions of the non-visible light filter layer 95 are all formed as light-blocking regions 95K.

That is to say, the color filter layer 91 and non-visible light filter layer 95 relating to the present embodiment are structured such that positions of arrangement of the light-receiving elements 80 that are objects of incidence of visible light and positions of arrangement of the light-receiving elements 80 that are objects of incidence of non-visible light are mutually alternated. Thus, with this structure, the image sensor 70 is formed to be capable of imaging visible light and non-visible light simultaneously.

Here, apart from the condition of the layer thickness of the n-type semiconductor substrate 87 and the provision of the glass substrate 72, structures, fabrication processes and the like of the image sensor 70 are conventionally known and will not be further described here.

Next, principal structures of a digital camera 10A relating to the present embodiment, in which the imaging device 50 structured as described above is employed, will be described with reference to FIG. 4.

The digital camera 10A is structured to include a lens 12, an optical unit 22 and the imaging device 50. The lens 12 is for focusing an image of a subject. The optical unit 22 guides light that has entered through the lens 12 to the light-receiving surfaces of the imaging device 50. The imaging device 50 is disposed such that the light-receiving surface that receives infrared light is oriented upward in FIG. 4 and the light-receiving surface that receives visible light is oriented downward in FIG. 4.

The optical unit 22 is provided with a prism 14, which is coated with a cold filter 14A, at a furthest upstream side of an optical axis L of the light that has passed through the lens 12. The cold filter 14A has optical characteristics for transmitting visible light and reflecting infrared light. Of the light that has passed through the lens 12, infrared light alone is reflected, to upward in FIG. 4, by the cold filter 14A of the prism 14.

At a downstream side in the direction of reflection of the infrared light, a reflection mirror 20A and a reflection mirror 20B are disposed in this order. The infrared light which has been reflected by the cold filter 14A is sequentially reflected by the reflection mirror 20A and the reflection mirror 20B, and is incident on the light-receiving surface of the imaging device 50 that detects infrared light.

Meanwhile, at a downstream side in the direction of progress of visible light, which is transmitted through the prism 14 rather than being reflected by the cold filter 14A, a prism 16 is disposed. The prism 16 includes a reflection surface which reflects the visible light. At a downstream side in a direction of reflection of the visible light from the reflection surface of the prism 16, a reflection mirror 20C and a reflection mirror 20D are disposed in this order. The visible light which has been reflected by the reflection surface of the prism 16 is sequentially reflected by the reflection mirror 20C and the reflection mirror 20D, and is incident on the light-receiving surface of the imaging device 50 that detects visible light.

In the digital camera 10A relating to the present embodiment, with the structure of the optical unit 22 as described above, it is possible to cause, of light representing a subject image that has entered through the common (same) lens 12, the visible light and the infrared light to be incident on the single imaging device 50, which is structured to be capable of imaging both the visible light and the infrared light.

Now, in accordance with differences in wavelengths of the visible light and the infrared light, focusing lengths of the visible light and the infrared light differ because of differences in refractive indices thereof in optical elements. Therefore, in the digital camera 10A relating to the present embodiment, the various members of the optical unit 22 are positioned so as to absorb the difference in focusing distances as much as possible with a difference between the optical path lengths of the visible light and the infrared light.

The difference in focusing lengths can be absorbed to a certain extent by this scheme of arrangement of the optical unit 22, but completely absorbing the difference is difficult.

Figure 4:
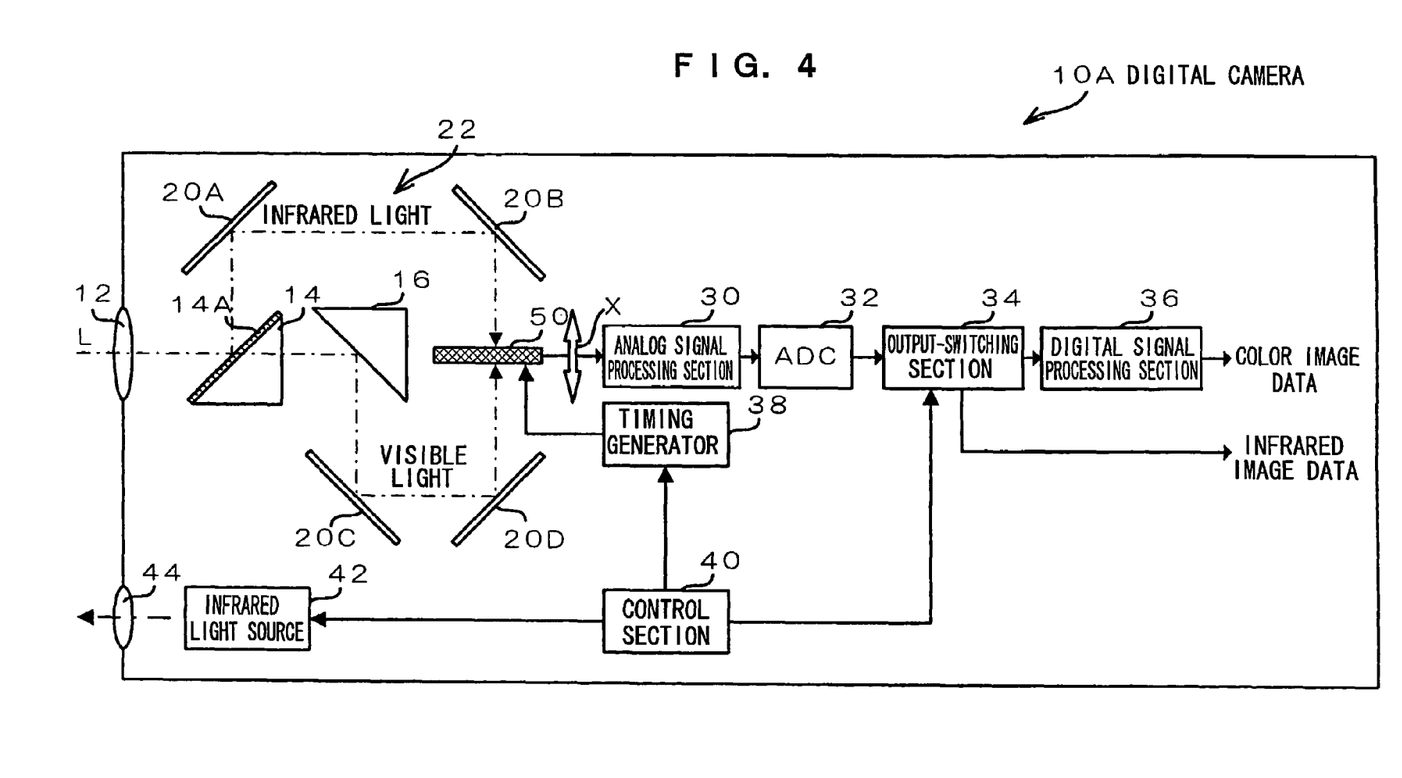
FIG. 4 is a block diagram showing structure of a digital camera relating to the first embodiment of the present invention.

Accordingly, in the digital camera 10A relating to the present embodiment, the imaging device 50 is structured to be movable within a predetermined range in the vertical direction of FIG. 4 (the direction of arrow X). Thus, focusing distances to the two faces of the imaging device 50, the front face and the rear face, are adjustable.

The digital camera 10A relating to the present embodiment is further structured to include an analog signal processing section 30, an analog/digital converter (below referred to as an ADC) 32, an output-switching section 34, a digital signal processing section 36 and a control section 40. The analog signal processing section 30 applies analog signal processing to analog signals which are inputted thereto. The ADC 32 converts analog signals inputted thereto to digital data. The output-switching section 34 switches an output destination of digital data inputted thereto to either of two pre-specified output destinations. The digital signal processing section 36 applies various kinds of digital signal processing to the digital data which is inputted thereto. The control section 40 manages overall operations of the digital camera 10A.

An output terminal of the imaging device 50 is connected to an input terminal of the analog signal processing section 30, an output terminal of the analog signal processing section 30 is connected to an input terminal of the ADC 32, and an output terminal of the ADC 32 is connected to an input terminal of the output-switching section 34. Accordingly, analog signals representing a subject image which are outputted from the imaging device 50 are subjected to predetermined analog signal processing by the analog signal processing section 30, including correlated double sampling processing, are converted to digital data by the ADC 32, and are then inputted to the output-switching section 34.

The output-switching section 34 relating to the present embodiment is connected to the control section 40. The output-switching section 34 has the function of, under the control of the control section 40, separating the digital data that is inputted from the imaging device 50 via the analog signal processing section 30 and the ADC 32 into data provided by the pixels of the imaging device 50 that receive visible light (below referred to as color image data) and data provided by the pixels that receive infrared light (below referred to as infrared image data), and outputting the data. Here, the output-switching section 34 relating to the present embodiment is structured to be capable of outputting either the color image data or the infrared image data, in accordance with a setting from the control section 40.

An output terminal of the output-switching section 34 that outputs the color image data is connected to an input terminal of the digital signal processing section 36. At the digital signal processing section 36, various kinds of digital signal processing are carried out on the color image data that is inputted, such as color synchronization processing, white balance adjustment processing, gamma processing, sharpness processing and the like. The color image data which has been subjected to the digital signal processing by the digital signal processing section 36 is recorded to a portable memory card in accordance with a photography instruction by a user (i.e., an operation of pressing a shutter release switch (a "shutter button")). Structures and processing for this recording are conventionally known, so will not be described here.

Meanwhile, an output terminal of the output-switching section 34 that outputs the infrared image data is connected to an infrared image processing section, which executes predetermined processing using the infrared image data. As this predetermined processing in the digital camera 10A relating to the present embodiment, processing for recording the inputted infrared image data to the portable memory card in accordance with a photography instruction by a user (i.e., the operation of pressing the shutter release switch) is employed.

The digital camera 10A is also provided with a timing generator 38, which principally generates timing signals for driving the imaging device 50 and supplies these timing signals to the imaging device 50. Driving of the imaging device 50 is controlled by the control section 40 via the timing generator 38.

The digital camera 10A is further provided with an infrared light source 42 and a focusing lens 44. The infrared light source 42 illuminates infrared light onto a subject. The focusing lens 44 focuses the infrared light emitted from the infrared light source 42 toward the subject. Conditions for emission of light by the infrared light source 42 are controlled by the control section 40.

The digital camera 10A relating to the present embodiment is equipped with, in addition to a photography mode for performing photography, a playback mode for replaying subject images in accordance with image data obtained by photography. Details thereof are conventionally known, so will not be described here.

As the photography mode for carrying out photography of the digital camera 10A relating to the present embodiment, either of a visible light photography mode, which carries out photography with visible light, and an infrared light photography mode, which carries out photography with infrared light, can be selectively set.

Figure 5:
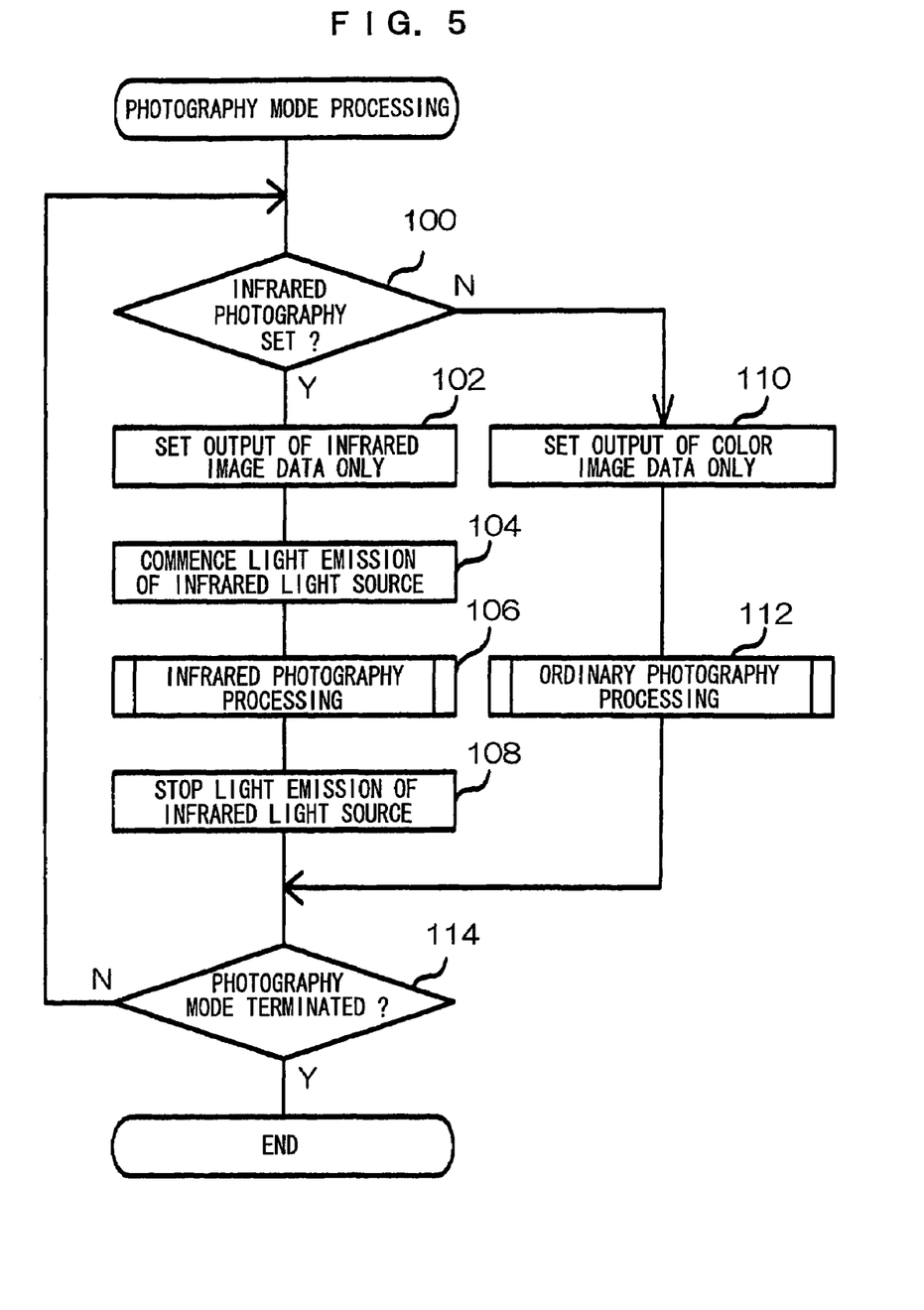
FIG. 5 is a flowchart showing a flow of processing of a photography mode processing program relating to the first embodiment of the present invention.

Next, an operation when the photography mode of the digital camera 10A relating to the present embodiment has been set will be described with reference to FIG. 5. FIG. 5 is a flowchart showing a flow of processing of a photography mode processing program, which is executed by the control section 40 of the digital camera 10A at this time. This program is pre-memorized in a memory incorporated at the control section 40. Herein, in order to avoid complexity, a case in which either the visible light photography mode or the infrared light photography mode has been specified by a user beforehand will be described.

First, in step 100, it is judged whether or not the infrared light photography mode has been set. If this judgment is positive, the processing advances to step 102.

In step 102, the output-switching section 34 is controlled so as to output only the infrared image data. Next, in step 104, the infrared light source 42 is controlled so as to commence light emission. Subsequently, in step 106, infrared photography processing for recording infrared image data is executed in accordance with the release switch pressing operation. Next, in step 108, control is performed so as to stop the light emission of the infrared light source 42 which was commenced by the processing of step 104. Thereafter, the processing advances to step 114.

On the other hand, if the judgment of step 100 is negative, it is assumed that the visible light photography mode has been set. The processing advances to step 110 and the output-switching section 34 is controlled so as to output only color image data. Subsequently, in step 112, ordinary photography processing for recording color image data is executed in accordance with the release switch pressing operation. Thereafter, the processing advances to step 114.

In step 114, it is judged whether or not the photography mode has been terminated by the user. If this judgment is negative, the processing returns to step 100 and the processing from step 100 onward is executed again. On the other hand, if this judgment is positive, the present photography mode processing program ends.

As described in detail hereabove, in the image sensor relating to the present embodiment, plural light-receiving elements (in the present embodiment, the light-receiving elements 80) with light-receiving surfaces at front faces thereof, which are provided inside the image sensor in the form of a matrix corresponding to the respective pixels and accumulate charges in accordance with light amounts of light that is received at the light-receiving surfaces, and a charge output component (in the present embodiment, the vertical charge transfer paths 82), which outputs the charges accumulated at the plural light-receiving elements to outside the image sensor, are provided and structure is formed to enable incidence of light on rear faces of the plural light-receiving elements, with charges being accumulated thereat by the plural light-receiving elements in accordance with light amounts of light that is received at the rear face. Thus, lights of different wavelengths can be imaged without this leading to a reduction in imaging sensitivity, a deterioration in focusing characteristics, an increase in power consumption and/or cost, or an increase in equipment size.

Moreover, the image sensor relating to the present embodiment is further provided with a first filter (in the present embodiment, the color filter layer 91), which is provided at the front face side of the plural light-receiving elements and transmits light of a predetermined wavelength (in the present embodiment, visible light) to be incident on at least some of the plural light-receiving elements, and a second filter (in the present embodiment, the non-visible light filter layer 95), which is provided at the rear face side of the plural light-receiving elements and transmits light of a wavelength different from the predetermined wavelength (in the present embodiment, infrared light) to be incident on at least some of the plural light-receiving elements. Thus, lights with mutually different predetermined wavelengths can be correctly made incident at the light-receiving surfaces at the front faces of the plural light-receiving elements and the light-receiving surfaces at the rear faces.

Moreover, in the image sensor relating to the present embodiment, the light-receiving elements are provided by layering a p-type well on an n-type semiconductor substrate, a layer thickness of which is set to a thickness that enables transmission of light of the wavelength different from the predetermined wavelength, and forming an n-type region at the p-type well. Thus, only the layer thickness of the n-type semiconductor substrate differs from previous solid state imaging devices, and the image sensor can be fabricated by fabrication processes substantially the same as for previous solid state imaging devices.

Moreover, in the image sensor relating to the present embodiment, a glass plate for reinforcement (here, the glass substrate 72) is provided at the rear face. Thus, a reduction in strength due to the layer thickness of the n-type semiconductor substrate being thinner can be compensated for.

Moreover, in the image sensor relating to the present embodiment, because the predetermined wavelength is a wavelength of visible light and the wavelength different from the predetermined wavelength is a wavelength of non-visible light, both visible light and non-visible light can be imaged.

Further, in the image sensor relating to the present embodiment, the first filter and the second filter are structured such that positions of arrangement of the light-receiving elements that are objects of incidence of the light of the predetermined wavelength and positions of arrangement of the light-receiving elements that are objects of incidence of the light of the wavelength different from the predetermined wavelength mutually alternate. Thus, light of the predetermined wavelength and light of the wavelength different from the predetermined wavelength can be imaged simultaneously.

Furthermore, the digital camera relating to the present embodiment includes the image sensor relating to the present embodiment, causes the light of the predetermined wavelength to be incident at the front face of the image sensor and causes the light of the wavelength different from the predetermined wavelength to be incident at the rear face of the image sensor, and performs control such that photography is implemented on the basis of charges resultantly outputted from the image sensor. Thus, similarly to the image sensor relating to the present embodiment, lights of different wavelengths can be imaged without this leading to a reduction in imaging sensitivity, a deterioration in focusing characteristics, an increase in power consumption and/or cost, or an increase in equipment size.

Anyway, for the present embodiment, a case in which a wavelength of visible light is employed as the predetermined wavelength of the present invention and a wavelength of non-visible light is employed as the wavelength different from the predetermined wavelength has been described. However, the present invention is not limited thus. Modes are possible in which the predetermined wavelength is a wavelength of non-visible light and the wavelength different from the predetermined wavelength is a wavelength of visible light. In such a case, the same effects as in the present embodiment can be provided.

Further, in the present embodiment, a case in which infrared light is employed as the non-visible light of the present invention has been described. However, the present invention is not limited thus. Modes are possible in which, for example, ultraviolet light is employed. In such a case, it is possible to realize photography with visible light and photography with ultraviolet light at a single image sensor.

Second Embodiment

For this second embodiment, another example of the color filter layer and non-visible light filter layer provided at the image sensor will be described. Structure of the image sensor 70 relating to this second embodiment is the same as the image sensor 70 relating to the first embodiment except in structures of the color filter layer and the non-visible light filter layer. Firstly, structures of a color filter layer 91' and a non-visible light filter layer 95' relating to this second embodiment will be described with reference to FIGS. 6A and 6B.

Figure 6A:
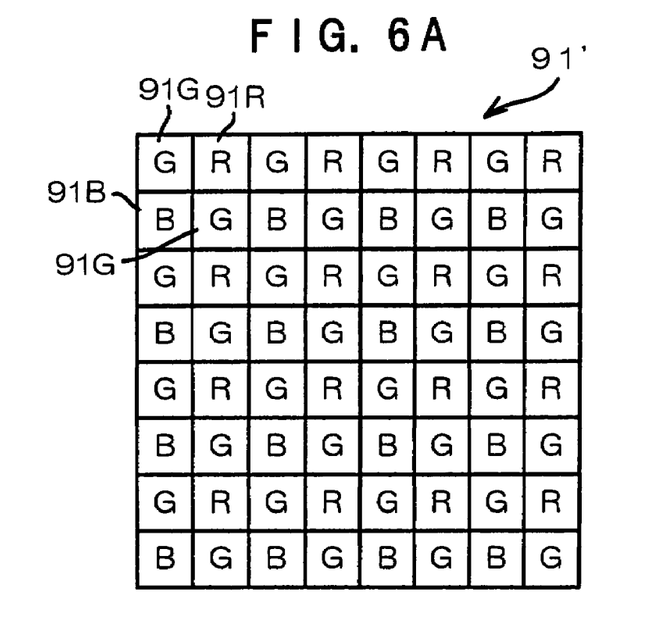
FIG. 6A is a schematic plan view showing structure of a color filter layer relating to a second embodiment of the present invention.
Figure 6B:
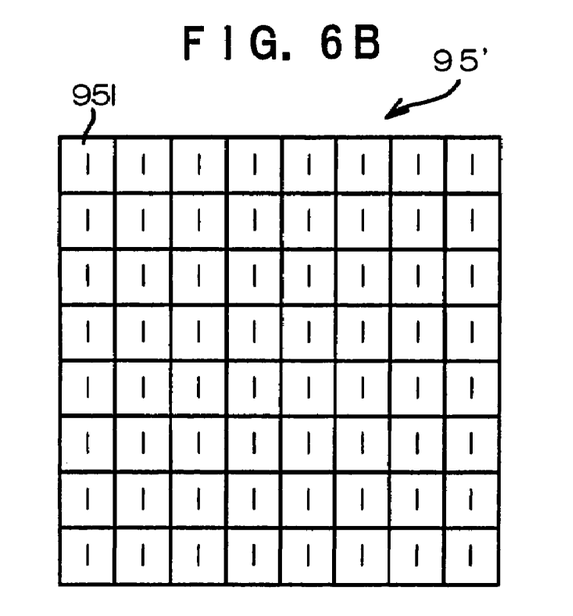
FIG. 6B is a schematic plan view showing structure of a non-visible light filter layer relating to the second embodiment of the present invention.

As shown in FIG. 6A, the color filter layer 91' relating to the present embodiment is structured by arraying plural sets in a matrix pattern, each set being one each of the red region 91R and the blue region 91B and two of the green region 91G On the other hand, as shown in FIG. 6B, the non-visible light filter layer 95' relating to the present embodiment is structured by arraying the non-visible light regions 95I in correspondence with all the pixels.

That is, the color filter layer 91' and non-visible light filter layer 95' relating to this second embodiment are structured such that lights of the wavelengths that are respective objects of transmission are incident at all the light-receiving elements 80 of the image sensor 70. With this structure, the image sensor 70 relating to this second embodiment is formed to be able, by successively and alternatingly imaging visible light and infrared light, to image the respective lights using all of the light-receiving elements, and as a result can improve imaging sensitivity.

Next, principal structures of a digital camera 10B relating to this second embodiment, in which the imaging device 50 including the image sensor 70 that is structured as described above is employed, will be described with reference to FIG. 7.

Figure 7:
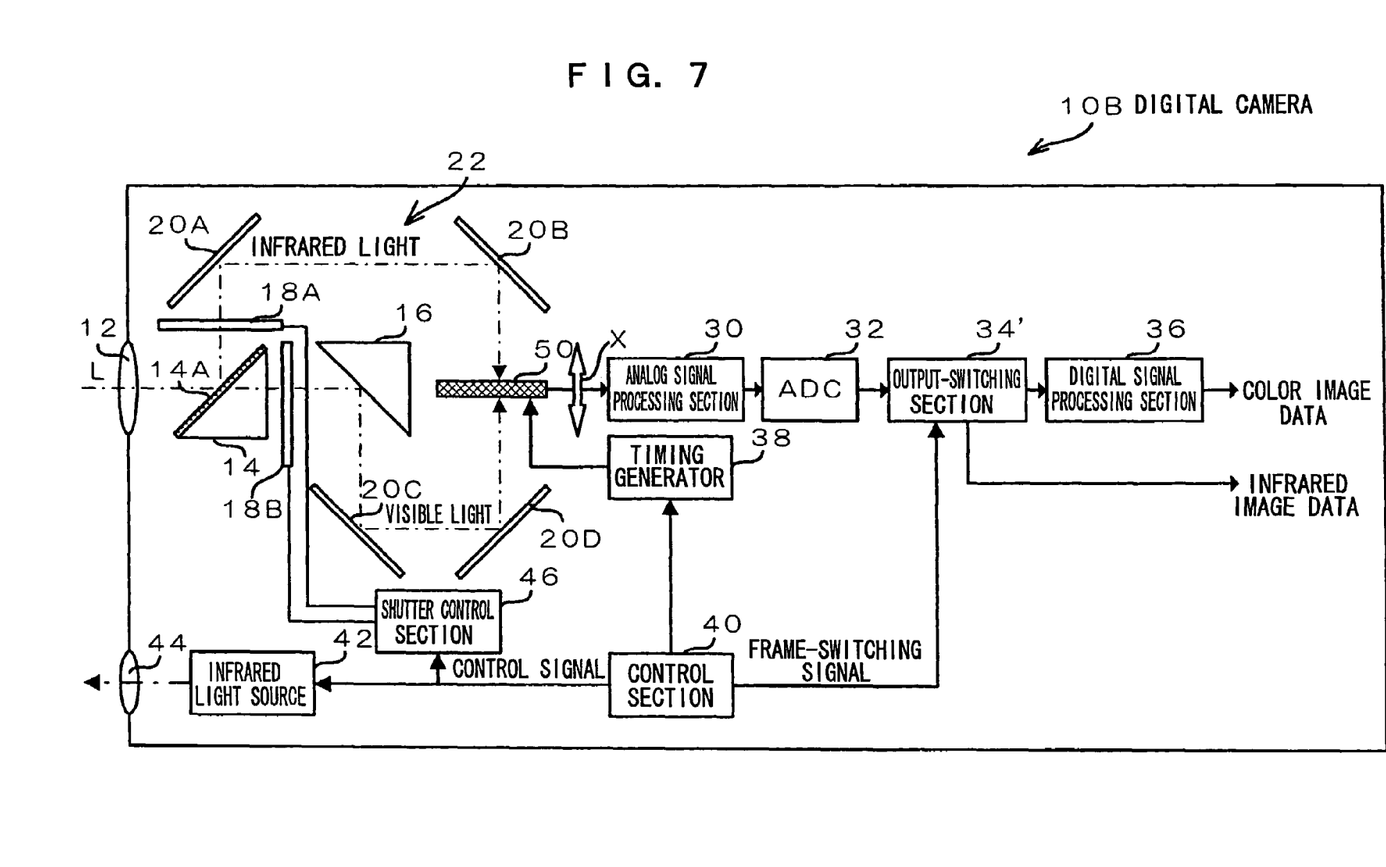
FIG. 7 is a block diagram showing structure of a digital camera relating to the second embodiment of the present invention.

Structural elements in FIG. 7 that are the same as in the digital camera 10A relating to the first embodiment as shown in FIG. 4 are assigned the same reference numerals and will not be described.

As shown in FIG. 7, the digital camera 10B relating to this second embodiment differs from the digital camera 10A relating to the first embodiment only in that a liquid crystal shutter 18A, a liquid crystal shutter 18B and a shutter-driving section 46 are additionally provided, and in that an output-switching section 34' is employed instead of the output-switching section 34. The shutter-driving section 46 drives the liquid crystal shutters 18A and 18B.

The liquid crystal shutter 18A is interposed between the cold filter 14A and the reflection mirror 20A, and fulfils a function of switching between blocking and transmitting the infrared light that has been reflected by the cold filter 14A. Meanwhile, the liquid crystal shutter 18B is interposed between the prism 14 and the prism 16, and fulfils a function of switching between blocking and transmitting the visible light that has been transmitted through the cold filter 14A. The shutter-driving section 46 is connected to the control section 40, and the blocking and transmission of the lights by the liquid crystal shutters 18A and 18B are controlled by the control section 40 via the shutter-driving section 46.

In the digital camera 10B relating to this second embodiment, a control signal inputted from the control section 40 to the shutter-driving section 46 for controlling states of the liquid crystal shutters 18A and 18B, and the control signal inputted from the control section 40 to the infrared light source 42 for controlling states of light emission of the infrared light source 42 are deployed as a common signal (below referred to as control signals).

In the digital camera 10B relating to this second embodiment, incidence of light through the liquid crystal shutter 18A onto the imaging device 50 and incidence of light through the liquid crystal shutter 18B onto the imaging device 50 are switched so as to be successively alternated, and control is performed so as to read out the charges accumulated at the image sensor 70 synchronously with the timings of the switching. Accordingly, the output-switching section 34' relating to this second embodiment has the function of, under the control of the control section 40, separating the digital data that is inputted from the ADC 32 into data obtained by the imaging device 50 receiving visible light (below referred to as color image data) and data obtained by receiving infrared light (below referred to as infrared image data), in states that are synchronous with the switching timings, and outputting the data.

In the digital camera 10B relating to this second embodiment, image frames that are captured alternate between visible light images and infrared light images. A frame-switching signal, which switches the image data to be outputted for each image frame, is outputted from the control section 40 to the output-switching section 34'. Obviously, the digital camera 10B is not limited to this mode; a mode is also possible in which either visible light images or infrared light images are successively captured. In such a case, the liquid crystal shutter disposed on the optical path of the light that is the imaging object is kept in the transmitting state and the other liquid crystal shutter is kept in the light-blocking state.

Figure 8:
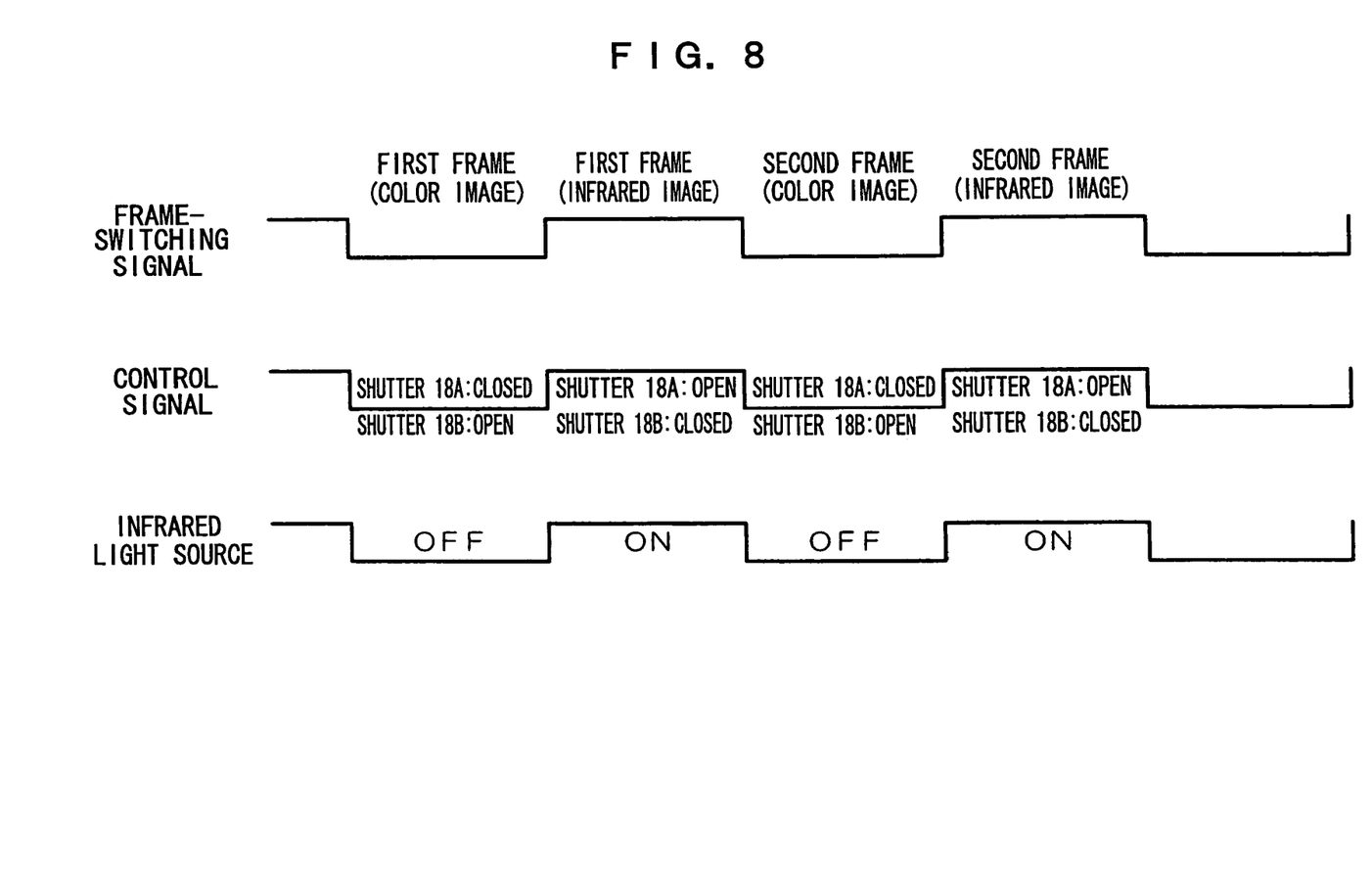
FIG. 8 is a timing chart of a frame-switching signal and control signals employed in the digital camera relating to the second embodiment of the present invention.

FIG. 8 shows an example of the frame-switching signal and the control signals relating to the present embodiment. The frame-switching signal shown in FIG. 8 is inputted to the output-switching section 34' and the control signals are inputted to the infrared light source 42 and the shutter-driving section 46. Accordingly, when the frame-switching signal is at a high level as shown in FIG. 8, the infrared light source 42 emits light, the liquid crystal shutter 18A is set to the transmitting state (an open state), and the liquid crystal shutter 18B is set to the light-blocking state (a closed state). As a result, imaging is performed by the imaging device 50 with infrared light and hence infrared image data is provided.

On the other hand, when the frame-switching signal is at a low level, the infrared light source 42 is a set to a non-light-emitting state, the liquid crystal shutter 18A is set to the light-blocking state (the closed state), and the liquid crystal shutter 18B is set to the transmitting state (the open state). As a result, imaging is performed by the imaging device 50 with visible light and hence color image data is provided.

Details of processing using the color image data and infrared image data that is outputted are similar to the digital camera 10A relating to the first embodiment, so will not be described here.

As has been described in detail hereabove, with the image sensor relating to the present embodiment, the same effects as with the image sensor relating to the previously described first embodiment can be realized. In addition, because the first filter and the second filter are structured to allow light of a wavelength that is a respective transmission object to be incident on all of the plural light-receiving elements, imaging of light of the respective wavelengths using all of the plural light-receiving elements is possible, by successively and alternately imaging the light of the predetermined wavelength (here, visible light) and the light of the wavelength different from the predetermined wavelength (here, infrared light). As a result, imaging sensitivity can be improved.

Further, in the digital camera relating to the present embodiment, incidence of light through the front face incidence component (here, the prism 14, the prism 16, the reflection mirror 20C and the reflection mirror 20D) and incidence of light through the rear face incidence component (here, the cold filter 14A, the reflection mirror 20A and the reflection mirror 20B) are successively alternately switched. Correspondingly, control is performed such that the charges accumulated at the image sensor are read synchronously with timings of the switching. Therefore, imaging sensitivity can be practically improved.

Anyway, as the predetermined processing that is executed by the infrared image processing section in the embodiments described above, a case of applying processing for recording the captured infrared image data to a portable memory card in response to a photography instruction from a user (the release switch pressing operation) has been described. However, the present invention is not limited thus. Obviously, it is possible to apply other processing using the infrared image data, such as, for example, processing for finding the distance to a subject with the technology disclosed in JP-A No. 7-83614, processing for detecting a line of sight of a user with the technology disclosed in JP-A No. 7-43600, and so forth.

Figure 9:
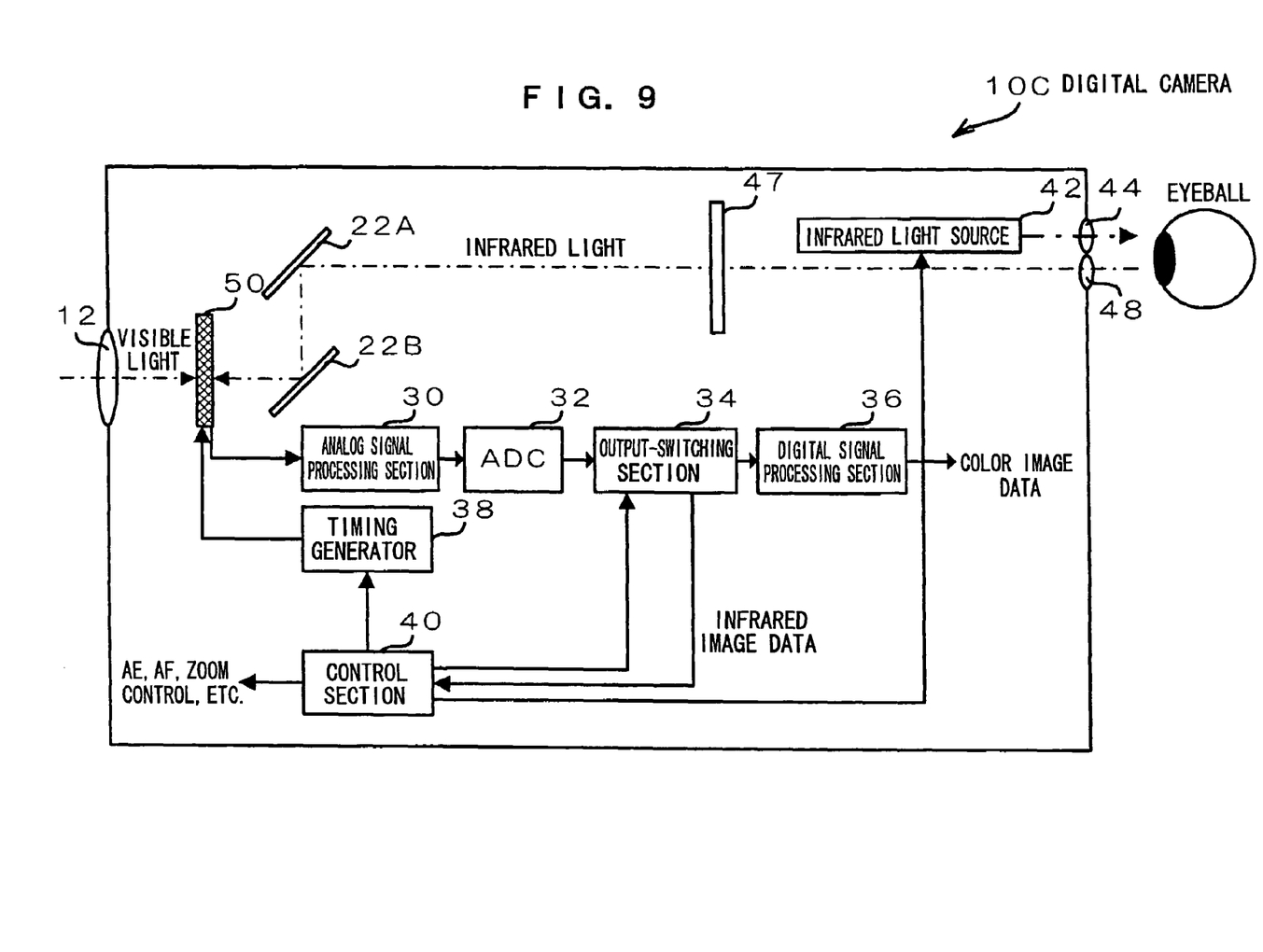
FIG. 9 is a block diagram showing another example of structure of a digital camera, which employs an imaging device relating to an embodiment of the present invention.

FIG. 9 shows a structural example of a digital camera 10C for a case in which processing for detecting a line of sight of a user is performed. Structural elements that are the same in FIG. 9 as in FIG. 4 are assigned the same reference numerals as in FIG. 4.

In the digital camera 10C shown in FIG. 9, the imaging device 50 is disposed such that the light-receiving surface that detects visible light is oriented to the direction of an optical axis L of light (visible light) that is incident via the lens 12, and the light-receiving surface that detects infrared light is oriented to a rear side of the digital camera 10C.

Further, the digital camera 10C is provided with an electronic viewfinder 47. The infrared light source 42 is disposed in a vicinity of a viewing window which is viewed when the electronic viewfinder 47 is being looked into. The focusing lens 44 is provided, and focuses the infrared light emitted from the infrared light source 42 toward an eyeball of a user. A lens 48 and two reflection mirrors 22A and 22B are provided. The lens 48 is disposed in a vicinity of the viewing window, at a position corresponding to a direction of reflection of the infrared light from the eyeball of the user. The lens 48 is for focusing the reflected infrared light. Thus, a structure is formed in which the infrared light reflected by the eyeball is focused by these members at the light-receiving surface of the imaging device 50 that detects infrared light.

In this structure, the output terminal of the output-switching section 34 that outputs infrared image data is connected to the control section 40. The line of sight of the user is detected by the control section 40 on the basis of infrared image data provided via the output-switching section 34. In accordance with detection results of the line of sight, AE (automatic exposure) control, AF (autofocus) control, zoom operations and the like which are desired by the user can be implemented.

With this structure too, the same effects as in the embodiments described above can be realized.

Anyway, the structures of light-receiving elements, image sensors and digital cameras relating to the embodiments described above (see FIGS. 1, 4, 6A, 6B and 7) are examples. Obviously, suitable modifications are possible within a scope not departing from the spirit of the present invention.

For example, for the embodiments described above, cases in which a CCD area sensor is employed as the image sensor of the present invention have been described. However, the present invention is not limited thus. For example, other solid state image sensors, such as CMOS image sensors and the like, can be employed. In such cases too, the same effects as in the above-described embodiments can be realized.

Further, for the embodiments described above, cases in which the color filter layer 91 (91') and non-visible light filter layer 95 (95') are provided integrally with the image sensor 70 have been described. However, the present invention is not limited thus. Modes are possible in which a filter which acts similarly to the color filter layer 91 (91') (below referred to as a visible light filter) and a filter which acts similarly to the non-visible light filter layer 95 (95') (below referred to as a non-visible light filter, are provided separately from the image sensor 70. In such a case, the visible light filter is disposed at, for example, any position on the optical path of the visible light in the optical unit 22 shown in FIG. 4 or FIG. 7, and the non-visible light filter is disposed at any position on the optical path of the non-visible light in the optical unit 22. However, in consideration of ease of positioning relative to the light-receiving elements 80 of the imaging device 50, it is preferable if these filters are disposed in the vicinity of the imaging device 50. Filter structures of the visible light filter and the non-visible light filter in such a case can be exemplified by filters with structures the same as shown in FIGS. 3A and 3B or FIGS. 6A and 6B.

In such a case too, the same effects as in the embodiments described above can be realized.

Further, the flow of processing of the photography mode processing program described for the first embodiment (see FIG. 5) is also an example. Obviously, modifications to the processing sequence, modifications to processing details, deletions of unnecessary steps, additions of new steps, and the like are possible within a scope not departing from the spirit of the present invention.

Further, the timing chart of the frame-switching signal and control signals applied to the second embodiment (see FIG. 8)

is also an example. Obviously, suitable modifications are possible within a scope not departing from the spirit of the present invention.

An image sensor of a first aspect of the present invention includes: a plurality of image-receiving elements disposed inside the image sensor in a matrix arrangement corresponding to respective pixels, the light-receiving elements each including a light-receiving surface at a front face and accumulating charge in accordance with light amounts of light received at the image-receiving surface; and a charge output component which outputs the charges accumulated at the plurality of light-receiving elements to outside the image sensor, the image sensor being structured to enable incidence of light on rear faces of the plurality of light-receiving elements, and the plurality of light-receiving elements being capable of accumulating charges in accordance with light amounts of light received at the rear faces.

According to the image sensor of the first aspect, the plural light-receiving elements with light-receiving surfaces at front faces thereof, which correspond to respective pixels and are provided in a matrix inside the image sensor, accumulate charges in accordance with light amounts of light that is received at the light-receiving surfaces, and the charges accumulated at the plural light-receiving elements are outputted to outside the image sensor by the charge output component.

Further, the image sensor of the present invention is structured to enable light to be incident at rear faces of the plural light-receiving elements, with charges being accumulated by the plural light-receiving elements in accordance with light amounts of light that is received at the rear faces.

That is, with the present invention, according to the structure described above, the plural light-receiving elements are provided inside the image sensor in the form of a matrix corresponding to respective pixels and accumulate charges in accordance with light amounts of light that is received, and the plural light-receiving elements are formed to be capable of receiving light through both the front faces and rear faces thereof. Therefore, it is possible to capture lights of different wavelengths by causing the lights of different wavelengths to be incident from the front face and the rear face of a single image sensor. Here, because the plural light-receiving elements are used for receiving both incident light from the front face and incident light from the rear face, a reduction in imaging sensitivity, an increase in power consumption and costs, and an increase in equipment size will not result. Furthermore, with the present invention, because the two incident lights can be made incident on the front face and the rear face along respectively different paths, a deterioration in focusing characteristics, which is caused by a difference in focusing distances of incident lights in a case in which incident paths of two incidence lights are the same, will not result.

Thus, because, according to the image sensor of the first aspect, the plural light-receiving elements with light-receiving surfaces at front faces thereof, which are provided inside the image sensor in a matrix pattern to correspond to respective pixels and accumulate charges in accordance with light amounts of light that is received at the light-receiving surfaces, and the charge output component, which outputs the charges accumulated at the plural light-receiving elements to the outside, are provided and structure is formed to enable incidence of light at the rear faces of the plural light-receiving elements with charges being accumulated by the plural light-receiving elements in accordance with light amounts of light that is received at the rear face, light of different wavelengths can be imaged without this leading to a reduction in imaging sensitivity, a deterioration in focusing characteristics, increases in power consumption and/or costs, or an increase in equipment size.

The present invention may, as in a second aspect, further include: a first filter disposed at the front face side of the plurality of light-receiving elements, the first filter transmitting light of a predetermined wavelength and causing the light of the predetermined wavelength to be incident on at least some of the plurality of light-receiving elements; and a second filter disposed at the rear face side of the plurality of light-receiving elements, the second filter transmitting light of a wavelength different from the predetermined wavelength and causing the light of the wavelength different from the predetermined wavelength to be incident on at least some of the plurality of light-receiving elements. Accordingly, lights with mutually different predetermined wavelengths can be correctly made incident at the light-receiving surfaces at the front faces of the plural light-receiving elements and the light-receiving surfaces at the rear faces.

The light-receiving elements of the present invention may, as in a third aspect, be provided by layering a p-type well on an n-type semiconductor substrate, a layer thickness of the substrate being set to a thickness that enables transmission of the light of the wavelength different from the predetermined wavelength, and forming an n-type region at the p-type well. Accordingly, only the layer thickness of the n-type semiconductor substrate is different from previous solid state imaging devices, and the image sensor can be fabricated by fabrication processes substantially the same as for previous solid state imaging devices.

However, in such a case, the layer thickness of the n-type semiconductor substrate is thinner than previously, as a result of which strength of the image sensor is lower.

Accordingly, the third aspect may, as in a fourth aspect, be provided with a glass plate for reinforcement. Thus, the reduction in strength caused by the thinning of the layer thickness of the n-type semiconductor substrate can be compensated for.

In any of the second to fourth aspects, it is possible that, as in a fifth aspect, either the predetermined wavelength is a wavelength of visible light and the wavelength different from the predetermined wavelength is a wavelength of non-visible light, or the predetermined wavelength is a wavelength of non-visible light and the wavelength different from the predetermined wavelength is a wavelength of visible light. Thus, both visible light and non-visible light can be imaged.

The first filter and second filter of any of the second to fifth aspects may, as in a sixth aspect, be structured such that positions of arrangement of the light-receiving elements that are objects of incidence of the light of the predetermined wavelength mutually alternate with positions of arrangement of the light-receiving elements that are objects of incidence of the light of the wavelength different from the predetermined wavelength. As a result, light of the predetermined wavelength and light of the wavelength different from the predetermined wavelength can be imaged simultaneously.

The first filter and second filter of any of the second to fifth aspects may, as in a seventh aspect, be structured such that the respective lights of the wavelengths that are objects of transmission are caused to be incident at all of the plurality of light-receiving elements. Accordingly, by imaging the light of the predetermined wavelength and the light of the wavelength different from the predetermined wavelength successively alternately, it is possible to perform imaging using all of the plural light-receiving elements, as a result of which imaging sensitivity can be further improved.

Further, in order to achieve the object described above, a digital camera of an eighth aspect includes: the image sensor of any of the second to seventh aspects; a front face incidence component that allows the light of the predetermined wavelength to be incident on the front face of the image sensor; a rear face incidence component that allows the light of the wavelength different from the predetermined wavelength to be incident on the rear face of the image sensor; and a control component that controls so as to perform photography on the basis of the charges outputted from the image sensor.

The digital camera of the eighth aspect is equipped with the image sensor of the present invention. Light of the predetermined wavelength is caused to be incident at the front face of the image sensor by the front face incidence component, while light of the wavelength different from the predetermined wavelength is caused to be incident at the rear face of the image sensor by the rear face incidence component. The control component controls such that photography is implemented on the basis of charges outputted from the image sensor.

Thus, according to the digital camera of the eighth aspect, because the digital camera includes the image sensor of the present invention while light of the predetermined wavelength is made incident at the front face of the image sensor, light of the wavelength different from the predetermined wavelength is made incident at the rear face of the image sensor and control is performed such that photography is implemented on the basis of charges that are correspondingly outputted from the image sensor, similarly to the image sensor of the present invention, lights of different wavelengths can be imaged without this leading to a reduction in imaging sensitivity, a deterioration in focusing characteristics, increases in power consumption and/or costs, or an increase in equipment size.

If the image sensor is the image sensor of the seventh aspect, the control component of the present invention may, as in a ninth aspect, perform switching such that incidence of light due to the front face incidence component and incidence of light due to the rear face incidence component are successively alternated, and perform control so as to read out charges that are correspondingly accumulated at the image sensor synchronously with timings of the switching. Thus, similarly to the seventh aspect, imaging sensitivity can be further improved.

Further still, in order to achieve the object described above, a digital camera of a tenth aspect includes: the image sensor of the first aspect; a first filter that is provided in correspondence with the front face side of the plurality of light-receiving elements of the image sensor, transmits light of a predetermined wavelength and causes the light of the predetermined wavelength to be incident on at least some of the plurality of light-receiving elements; a second filter that is provided in correspondence with the rear face side of the plurality of light-receiving elements of the image sensor, transmits light of a wavelength different from the predetermined wavelength and causes the light of the wavelength different from the predetermined wavelength to be incident on at least some of the plurality of light-receiving elements; a front face incidence component that allows the light of the predetermined wavelength to be incident on the front face of the image sensor via the first filter; a rear face incidence component that allows the light of the wavelength different from the predetermined wavelength to be incident on the rear face of the image sensor via the second filter; and a control component that controls so as to perform photography on the basis of the charges outputted from the image sensor.

The digital camera of the tenth aspect is provided with the image sensor of the present invention. Light of the predetermined wavelength is caused to be incident at the front face of the image sensor by the front face incidence component via the first filter, which is provided in correspondence with the front face side of the plural light-receiving elements of the image sensor and transmits the light of the predetermined wavelength to be incident on at least some of the plural light-receiving elements. Meanwhile, light of the wavelength different from the predetermined wavelength is caused to be incident at the rear face of the image sensor by the rear face incidence component via the second filter, which is provided in correspondence with the rear face side of the plural light-receiving elements of the image sensor and transmits the light of the wavelength different from the predetermined wavelength to be incident on at least some of the plural light-receiving elements. The control component controls such that photography is implemented on the basis of charges outputted from the image sensor.

Thus, according to the digital camera of the tenth aspect, because the image sensor of the present invention is included while light of the predetermined wavelength is made incident at the front face of the image sensor via the first filter, light of the wavelength different from the predetermined wavelength is made incident at the rear face of the image sensor via the second filter and control is performed such that photography is implemented on the basis of charges correspondingly outputted from the image sensor, similarly to the image sensor of the present invention, lights of different wavelengths can be imaged without this leading to a reduction in imaging sensitivity, a deterioration in focusing characteristics, increases in power consumption and/or costs, or an increase in equipment size.

According to the present invention, an effect is obtained in that it is possible to provide an image sensor and digital camera capable of imaging lights of different wavelengths without this leading to a reduction in imaging sensitivity, a deterioration in focusing characteristics, an increase in power consumption or cost, or an increase in equipment size.

What is claimed is:

1. An image sensor comprising:
 a plurality of light-receiving elements disposed inside the image sensor in a matrix arrangement corresponding to respective pixels, the light-receiving elements each including a light-receiving surface at a front face and accumulating charge in accordance with light amounts received at the light-receiving surface; and
 a charge output component that outputs the charges accumulated at the plurality of light-receiving elements to outside the image sensor, wherein
 the image sensor is configured to enable incidence of light on rear faces of the plurality of light-receiving elements, and
 the plurality of light-receiving elements are capable of accumulating charges in accordance with light amounts received at the rear faces, and wherein the image sensor further comprises
 a first filter disposed at the front face side of the plurality of light-receiving elements, the first filter transmitting light of a predetermined wavelength and causing the light of the predetermined wavelength to be incident on at least some of the plurality of light-receiving elements; and
 a second filter disposed at the rear face side of the plurality of light-receiving elements, the second filter transmitting light of a wavelength different from the predetermined wavelength and causing the light of the wavelength different from the predetermined wavelength to be incident on at least some of the plurality of light-receiving elements.

2. The image sensor of claim 1, wherein the light-receiving elements are provided by layering a p-type well on an n-type semiconductor substrate, a layer thickness of the substrate being set to a thickness that enables transmission of the light of the wavelength different from the predetermined wavelength, and forming an n-type region at the p-type well.

3. The image sensor of claim 2, wherein a glass plate for reinforcement is provided at the rear face.

4. The image sensor of claim 1, wherein
either the predetermined wavelength is a wavelength of visible light and the wavelength different from the predetermined wavelength is a wavelength of non-visible light,
or the predetermined wavelength is a wavelength of non-visible light and the wavelength different from the predetermined wavelength is a wavelength of visible light.

5. The image sensor of claim 1, wherein the first filter and the second filter are configured such that positions of arragement of the light-receiving elements that are objects of incidence of the light of the predetermined wavelength mutually alternate with positions of arrangement of the light-receiving elements that are objects of incidence of the light of the wavelength diifferent from the predetermined wavelength.

6. The image sensor of claim 1, wherein the first filter and the second filter are configured such that the respective lights of the wavelengths that are objects of transmission are caused to be incident at all of the plurality of light-receiving elements.

7. A digital camera comprising:
an image sensor;
a front face incidence component;
a rear face incidence component; and
a control component, wherein
the image sensor includes:
a plurality of light-receiving elements disposed inside the image sensor in a matrix arrangement corresponding to respective pixels, the light-receiving elements each including a light-receiving surface at a front face and accumulating charge in accordance with light amounts received at the light-receiving surface;
a charge output component that outputs the charges accumulated at the plurality of light-receiving elements to outside the image sensor;
a first filter disposed at the front face side of the plurality of light-receiving elements, the first filter transmitting light of a predetermined wavelength and causing the light of the predetermined wavelength to be incident on at least some of the plurality of light-receiving elements; and
a second filter disposed at a rear face side of the plurality of light-receiving elements, the second filter transmitting light of a wavelength different from the predetermined wavelength and causing the light of the wavelength different from the predetermined wavelength to be incident on at least some of the plurality of light-receiving elements,
the image sensor is configured to enable incidence of light on rear faces of the plurality of light-receiving elements,
the plurality of light-receiving elements of the image sensor are capable of accumulating charges in accordance with light amounts received at the rear faces,
the front face incidence component allows the light of the predetermined wavelength to be incident on the front face of the image sensor,
the rear face incidence component allows the light of the wavelength different from the predetermined wavelength to be incident on the rear face of the image sensor, and
the control component controls so as to perform photography on the basis of the charges outputted from the image sensor.

8. The digital camera of claim 7, wherein the light-receiving elements are provided by layering a p-type well on an n-type semiconductor substrate, a layer thickness of the substrate being set to a thickness that enables transmission of the light of the wavelength different from the predetermined wavelength, and forming an n-type region at the p-type well.

9. The digital camera of claim 8, wherein a glass plate for reinforcement is provided at the rear face.

10. The digital camera of claim 7, wherein
either the predetermined wavelength is a wavelength of visible light and the wavelength different from the predetermined wavelength is a wavelength of non-visible light,
or the predetermined wavelength is a wavelength of non-visible light and the wavelength different from the predetermined wavelength is a wavelength of visible light.

11. The digital camera of claim 7, wherein the first filter and the second filter are configured such that positions of arrangement of the light-receiving elements that are objects of incidence of the light of the predetermined wavelength mutually alternate with positions of arrangement of the light-receiving elements that are objects of incidence of the light of the wavelength different from the predetermined wavelength.

12. The digital camera of claim 7, wherein the first filter and the second filter are configured such that the respective lights of the wavelengths that are objects of transmission are caused to be incident at all of the plurality of light-receiving elements.

13. The digital camera of claim 12, wherein the control component performs switching such that incidence of light due to the front face incidence component and incidence of light due to the rear face incidence component are successively alternated, and performs control so as to read out charges that are correspondingly accumulated at the image sensor synchronously with timings of the switching.

14. A digital camera comprising:
an image sensor;
a first filter;
a second filter;
a front face incidence component;
a rear face incidence component; and
a control component, wherein
the image sensor includes:
a plurality of light-receiving elements disposed inside the image sensor in a matrix arrangement corresponding to respective pixels, the light-receiving elements each including a light-receiving surface at a front face and accumulating charge in accordance with light amounts received at the light-receiving surface; and
a charge output component that outputs the charges accumulated at the plurality of light-receiving elements to outside the image sensor,
the image sensor is configured to enable incidence of light on rear faces of the plurality of light-receiving elements,
the plurality of light-receiving elements of the image sensor are capable of accumulating charges in accordance with light amounts received at the rear faces, the first filter is provided in correspondence with the front face side of the plurality of light-receiving elements of the image sensor, transmits light of a predetermined wavelength and causes the light of the predetermined wavelength to be incident on at least some of the plurality of light-receiving elements, the second filter is provided in correspondence with the rear face side of the plurality of light-receiving elements of the image sensor, transmits light of a wavelength different from the predetermined wavelength and causes the light of the wavelength different from the predetermined wavelength to be incident on at least some of the plurality of light-receiving elements, the front face incidence component allows the light of the predetermined wavelength to be incident on the front face of the image sensor via the first filter, the rear face incidence component allows the light of the wavelength different from the predetermined wavelength to be incident on the rear face of the image sensor via the second filter, and the control component controls so as to perform photography on the basis of the charges outputted from the image sensor.

* * * * *